United States Patent [19]
Boese et al.

[11] Patent Number: 5,423,075
[45] Date of Patent: Jun. 6, 1995

[54] COMBINED RADIO TRANSMISSION AND RECEPTION APPARATUS WITH A PLL CIRCUIT

[75] Inventors: Ingo Boese, Siegen; Volker Gebauer, Ginsheim-Gustavsburg, both of Germany

[73] Assignee: Temic Telefunken microelectronic GmbH, Heilbronn, Germany

[21] Appl. No.: 5,367

[22] Filed: Jan. 21, 1993

[30]  Foreign Application Priority Data

Jan. 21, 1992 [DE] Germany ............. 42 01 415.8

[51] Int. Cl.⁶ .................................... H04B 1/40
[52] U.S. Cl. ............................. 455/86; 455/78; 455/260; 332/127; 375/219; 375/327
[58] Field of Search ............ 455/73, 75, 76, 78, 455/79, 84, 85, 86, 260, 112, 21, 23, 205, 208, 214; 375/81, 9, 120; 331/18, 23; 332/127

[56]   References Cited
   U.S. PATENT DOCUMENTS

| | | | |
|---|---|---|---|
| 4,130,733 | 12/1978 | Ashford . | |
| 4,404,685 | 9/1983 | Rogers . | |
| 4,489,413 | 12/1984 | Richmond et al. . | |
| 4,520,476 | 5/1985 | Searl . | |
| 4,542,531 | 9/1985 | Fukumura | 455/76 |
| 4,864,257 | 9/1989 | Vandegraaf | 332/127 |
| 4,994,768 | 2/1991 | Shepherd et al. | 332/127 |
| 5,175,729 | 12/1992 | Borras et al. | 455/76 |
| 5,276,913 | 1/1994 | Lee et al. | 455/76 |

FOREIGN PATENT DOCUMENTS

| | | |
|---|---|---|
| 0322139 | 6/1989 | European Pat. Off. . |
| 3201039 | 1/1982 | Germany . |
| 3029054 | 3/1982 | Germany . |
| 3106058 | 9/1982 | Germany . |
| WO89/07865 | 8/1989 | WIPO . |

OTHER PUBLICATIONS

Patent Abstracts of Japan, vol. 6, No. 170 (E-128), May 31st, 1982, JP-A-57 087 212 (Mitsubishi).
Patent Abstracts of Japan, vol. 6, No. 170 (E-128), May 31st, 1982 & JP-A-57 087 212 (Mitsubishi).
Patent Abstracts of Japan, vol. 9, No. 027 (E-294), Sep. 27th, 1984 & JP-A-59 171 334 (Matsushita).
Roland Best "Theorie und Anwendungen des Phase-locked Loops"; AT Verlag, 1987.
Ulf Assmus "Datenübertragung in DSR"; Rundfunktechnische Mitteilungen, Jg. 33, 198, H.1, S. 1–7.

*Primary Examiner*—Reinhard J. Eisenzopf
*Assistant Examiner*—Nguyen Vo
*Attorney, Agent, or Firm*—Spencer, Frank & Schneider

[57]    ABSTRACT

A radio transmission and reception apparatus having a transmitting section and a receiving section for bidirectional data transmission between two end units in the time-division multiplex mode. Prior art radio transmission and reception apparatuses are equipped with a transmitting section and a receiving section that have separate PLL circuits for signal modulation and demodulation. The resultant expense for relatively expensive components can be considerably reduced in radio transmission and reception apparatuses if only one PLL circuit is provided in accordance with the invention, to which both the transmitting section and the receiving section have alternating access.

14 Claims, 4 Drawing Sheets

COMBINED RADIO TRANSMISSION AND RECEPTION APPARATUS WITH A PLL CIRCUIT

BACKGROUND OF THE INVENTION

The invention relates to a radio transmission and reception apparatus having a PLL circuit for modulation and demodulation, respectively.

Radio transmission and reception apparatuses in which the transmitting section and the receiving section are each equipped with a PLL circuit for signal modulation and demodulation or in which only the receiving section or the transmitting section has a PLL circuit are state of the art and are known from, for example, R. Best, "Theorie und Anwendung des Phase-locked Loops" [Theory and Application of the Phase Locked Loop], published by AT-Verlag, 1987, in particular pages 87–91. In the circuit arrays first mentioned, the high component requirement and hence the high manufacturing costs can be cited as a drawback. In the last-mentioned circuits, the advantages of PLL-controlled modulations or demodulations are dispensed with in either the transmitting section or the receiving section.

The object of the invention is therefore to provide a radio transmission and reception apparatus permitting the use of a PLL circuit in both the transmitting and receiving sections of the apparatus, with fewer components and a lower space requirement. The above object is achieved according to the present invention by a radio transmission and reception apparatus having a transmitting section and a receiving section, and wherein the transmitting and receiving sections have a common PLL circuit for signal modulation and demodulation, respectively. Preferably, the common PLL circuit comprises a phase detector, a first VCO and a further oscillator operating either as a reference oscillator or as a second VCO. A switch arrangement is provided such that in the transmitting state of the radio transmission and reception apparatus, the feedback loop of the PLL circuit is closed via the first VCO and the further oscillator operates as a reference oscillator, and, in the receiving state of the radio transmission and reception apparatus, the feedback loop is closed via the further oscillator operating now as a VCO (the first VCO being disabled) and the phase detector is connected to the output of an HF input stage.

One major advantage of the invention is that in a combined radio transmission and reception apparatus in accordance with the invention, a large proportion of the components of the phase-locked loop is used both for signal modulation during transmission as well as for signal demodulation during reception. This joint use of a circuit component for both the transmitting section and the receiving section can be used to particular advantage above all in radio transmission and reception apparatuses in which data transmission is bidirectional in the time-division multiplex mode. Performance of the transmission and reception tasks is not simultaneous, but alternating in time. The radio transmission and reception apparatus can be set to a transmitting or receiving state using simple switching methods. Various advantageous embodiments of the invention are likewise disclosed.

BRIEF DESCRIPTION OF THE DRAWINGS

The invention is described hereinafter on the basis of the figures, in which.

DETAILED DESCRIPTION OF THE PREFERRED EMBODIMENTS

Figure 1:
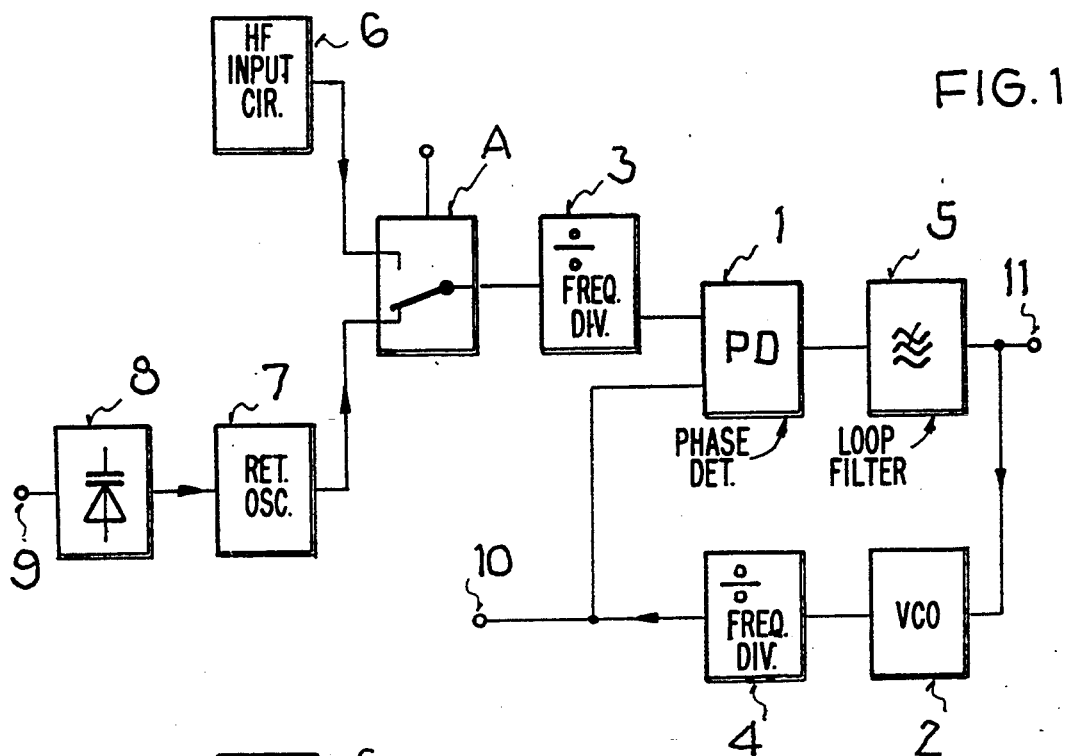
FIG. 1 shows a first embodiment of the invention for the first modulation type.
Figure 2:
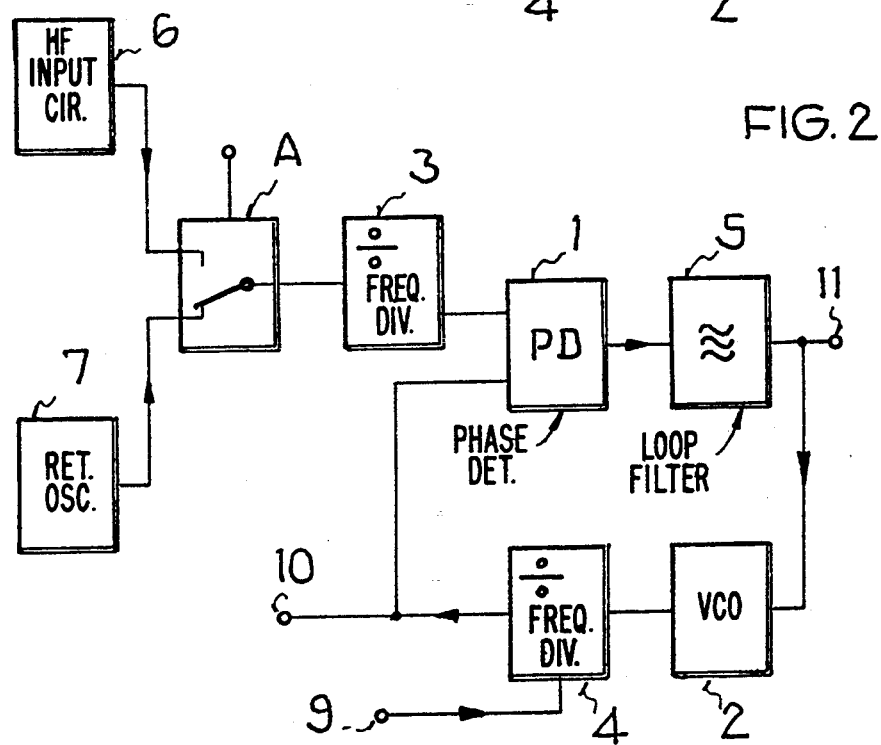
FIG. 2 shows a first embodiment of the invention for the second modulation type.

FIGS. 1 and 2 each show a first embodiment of the invention. These two circuits differ in how the signal is modulated. Firstly, however, the common features of the two circuits are described. Depending on the switch setting A, a first input of the phase detector 1 is supplied via a first frequency divider 3 either with the signal of an HF input circuit 6 or with the signal of a reference oscillator 7. This reference oscillator 7 may comprise an RC resonating circuit, a VCO, or preferably a quartz oscillator. The output signal of the phase detector 1 is supplied via a loop filter 5 to a first VCO 2 for controlling the latter. The output signal of this first VCO 2 is supplied via a second frequency divider 4 to the second input of the phase detector 1. The phase detector 1 forms, together with the first VCO 2, the first and second frequency dividers 3, 4 and the loop filter 5, a PLL circuit of the type well known to a person skilled in the art. This PLL circuit must be adapted to the respective requirements of the radio transmission and reception apparatus. This can be achieved with the aid of the divider ratios of the two frequency dividers 3, 4, the center frequency of the VCO or, for example, the properties of the loop filter 5. With the aid of the switch A, the PLL circuit can now be switched either to a transmitting or to a receiving state. In the switch setting as drawn in FIGS. 1 and 2, the two PLL circuits are in the transmitting state. The first input of the phase detector 1 is connected to the reference oscillator 7 via the first frequency divider 3. In the circuit in accordance with FIG. 1, the frequency of the reference oscillator 7 is changed, for example with the aid of a capacitance diode 8, depending on the data signal at the data input 9. The PLL circuit follows this signal and readjusts the first VCO 2 provided in the feedback path. Generally, the modulated signal thereby obtained is first divided and reduced once more in a second frequency divider 4, and then supplied to the second input of the phase detector 1. The modulated output signal 10 can be picked up at the output 10 of the second frequency divider 4 for further processing in an HF output section.

In the circuit according to FIG. 2, the first input of the phase detector 1 is connected to a permanently tuned reference oscillator 7. Modulation of the oscillation with the data signal is achieved, in contrast to the circuit according to FIG. 1, by a change in the divider ratio of the second frequency divider 4 inside the feedback loop of the PLL circuit. The divider ratio of the second frequency divider 4 is changed depending on the signal present at the data input 9, and the PLL circuit is thus pulled in its frequency. The PLL circuit now tries to equalize the phase difference occurring at the phase detector 1 by corresponding operation of the first VCO 2. An oscillation that is frequency-modulated with the data signal is now obtained at the output of the VCO 2.

As in the circuit according to FIG. 1, the modulated output signal 10 is coupled out at the connecting point of the second input of the phase detector 1 with the second frequency divider 4. Both modulation types are known as frequency shift keying (FSK).

The receiving state of the two circuits according to FIG. 1 and FIG. 2 is attained by changing the switch setting A shown in FIGS. 1 and 2. The phase detector 1 is then connected via the first frequency divider to the HF input section 6 of the radio transmission and receiving apparatus. The phase detector 1, together with the first VCO 2 disposed in the feedback branch, forms a phase locked loop. The demodulated input signal can be picked up at the output 11 of the loop filter 5 for further signal processing.

In the circuits according to FIGS. 1 and 2, the problem in principle is that, in the ICs that are available on the market for PLL circuits and contain substantially the frequency dividers and the phase detector, the inputs for the reference oscillator or HF section have relatively low limit frequencies and are hence unsuitable for the combined transmission and reception concept in accordance with the invention which operates with higher transmission frequencies in the VHF and UHF frequency ranges. The two circuits according to FIGS. 3 and 4 bypass this problem.

Figure 3:
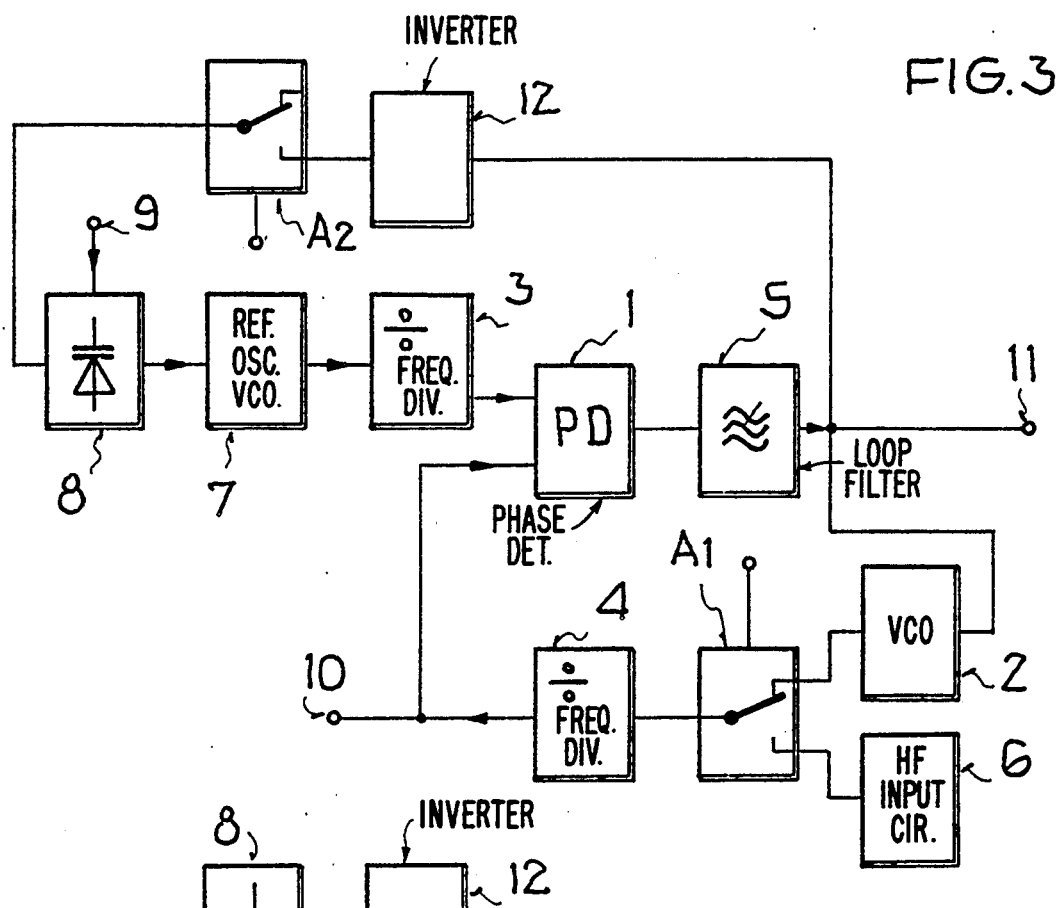
FIG. 3 shows a second embodiment of the invention for the first modulation type.
Figure 4:
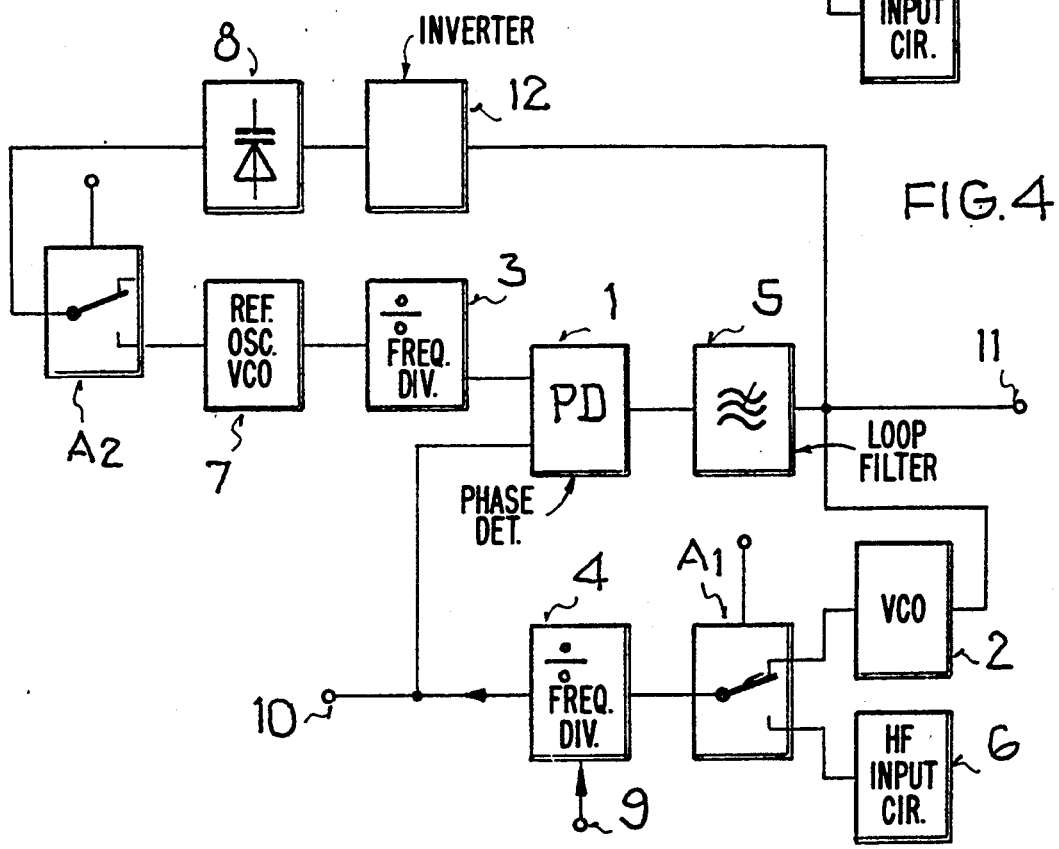
FIG. 4 shows a second embodiment of the invention for the second modulation type.

In the radio transmission and receiving apparatuses according to FIGS. 3 and 4, the feedback loop and the reference input are changed around when switching from the transmitting state to the receiving state. In the transmitting state, the switches A1 and A2 are in the settings shown in FIGS. 3 and 4. A reference oscillator 7 is connected to the first input of the phase detector 1. The output signal of the reference oscillator 7 is generally first passed through a first frequency divider stage 3 and reduced in frequency on the basis of the divider ratio. The output signal of the phase detector 1 is supplied to a loop filter stage 5 and then to the VCO 2 for oscillation control. The output signal of the VCO 2 passes via the switch A1 and a second frequency divider stage 4 to the second input of the phase detector 1.

In the arrangement according to FIG. 3, modulation of the oscillating state of the phase-locked loop is achieved by detuning the reference oscillator 7, for example with a capacitance diode 8. To do so, the capacitance diode 8 is supplied with a suitably processed data signal at the data input 9.

In the arrangement according to FIG. 4, the modulation of the oscillating state of the phase-locked loop is achieved by changing the divider ratio of the second frequency divider stage 4 inside the feedback branch analogously to a data signal. To do so, the second frequency divider stage 4 is supplied with a divider ratio that is proportional to the data signal at the data input 9.

In both cases, the modulated output signal at the data output 10 can be picked up at the second input of the phase detector.

Figure 6:
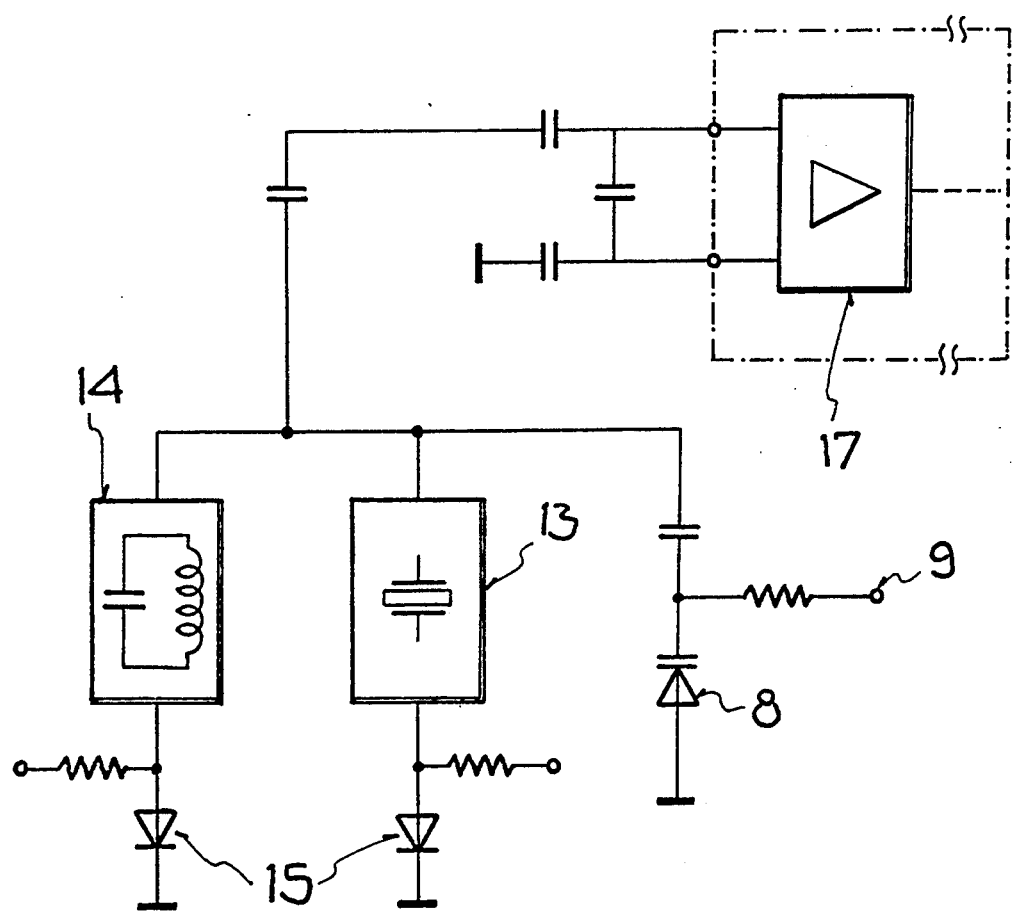
FIG. 6 shows a switchable reference oscillator/VCO.

In the case of reception, the switch settings as drawn in the Figures must be reversed. The output signal of the HF input circuit 6 is then supplied to the phase detector 1 at the second input via the second frequency divider stage 4. The feedback loop of the phase locked loop is routed from the output of the phase detector 1 via the loop filter 5, the reference oscillator 7 and the first frequency divider stage 3 back to the first input of the phase detector 1. At the output of the loop filter stage 5 is the data output 11 of the radio transmission and receiving apparatus. From here, the demodulated reception signal can be passed on for further signal processing. In this embodiment of the invention, the reference oscillator 7 must provide not only a quartz-accuracy reference oscillation; in the receiving state of the circuit, the reference oscillator operates as a voltage controlled oscillator, abbreviated as VCO. This is shown in FIGS. 3 and 4 by the capacitance diode 8. The oscillation behavior of the reference oscillator 7 must be controlled proportionally to the output voltage of the phase detector I using suitable measures. This can be achieved by, for example, a reference oscillator as shown in FIG. 6.

Depending on the control of the reference oscillator 7 by means of the capacitance diode 8, it may become necessary to incorporate an inverter 12 into the feedback loop of the receiving state. Since the sign of the phase difference changes when switching from the transmitting to the receiving state as a result of the exchange of the reference oscillator 7 for the VCO 2 at the two inputs of the phase detector 1, the sign of the control voltage must be changed accordingly. This can be achieved advantageously by using the inverter 12, which is inserted into the feedback loop, and reversing the sign of the control voltage.

Figure 5:
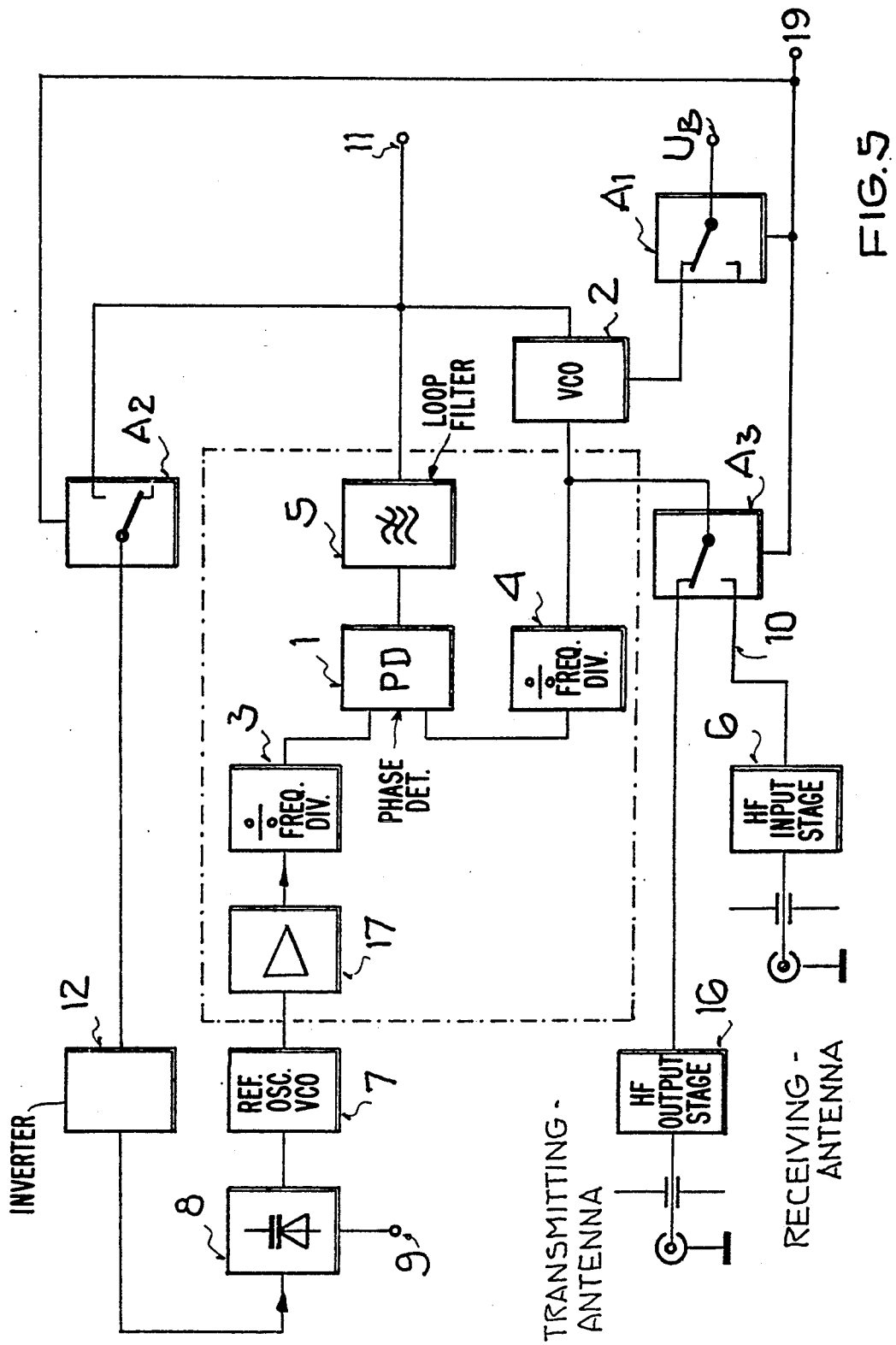
FIG. 5 shows a radio transmission and reception apparatus based on a circuit according to FIG. 3.

FIG. 5 shows a further advantageous embodiment of a radio transmission and receiving apparatus in accordance with the invention. This version is structured, as regards its working principle, in the same way as the version in FIG. 3. Its nucleus is the phase detector 1. The output of the phase detector 1 is connected to the first VCO 2 via the loop filter 5. When the first VCO 2 is connected to the operating voltage $U_B$ by way of the switch A1, the first VCO 2 operates, and the feedback loop of the phase-locked loop is closed via the VCO 2 and the second frequency divider stage 4 to the second input of the phase detector 1. Since the switch A2 is open in the transmitting state, the second oscillator 7 operates as the reference oscillator. This second oscillator 7 is connected to the first input of the phase detector 1 via an active element 17 and a first frequency divider stage 3. The second oscillator 7 operating as the reference oscillator is detuned around its center frequency proportionally to the data signal at the data input 9 using a capacitance diode 8. The phase-locked loop follows this detuning, so that the modulated output signal is supplied to the HF output stage 16 via the switch A3. The HF output stage 16 feeds the signal into the transmitting antenna.

In the receiving state, all switch settings of switches A1 to A3 shown in FIG. 5 must be reversed e.g., via a common signal at control input 19. The switch A1 interrupts the voltage supply $U_B$ of the first VCO 2, so that at this point the original feedback path of the phase-locked loop is interrupted. Instead, the second input of the phase detector 1 is supplied via the second frequency divider stage 4 and the switch A3 with the receiving signal preprocessed by the HF input stage 6. The radio transmission and receiving apparatus can be designed here in such a way that the signals are transmitted and received via a common antenna. In the advantageous embodiment in accordance with FIG. 5, however, separate transmitting and receiving antennas are provided. The second input of the phase detector 1 is supplied in the receiving state with the input signal of the receiving section as a reference signal. The feedback branch of the phase-locked loop is now formed by the loop filter 5, the switch A2 closed in the receiving state, and the second oscillator 7 operating as a controllable oscillator. This second oscillator 7 can be switched in its function between quartz-accuracy reference oscillator and voltage-controlled oscillator, and may be designed, for example, as shown in FIG. 6. The oscillator is actuated by an inverter 12 and a capacitance diode 8. Since the oscillator 7 is connected via an active element 17 and the first frequency divider stage 3 to the first input of the phase detector 1, the feedback branch of the phase locked loop is closed by this branch of the circuit in the case of reception. The demodulated signal can be picked up at the output of the loop filter 5 and passed on for further signal processing. A dash-dotted line in FIG. 5 encloses all circuit blocks generally incorporated on a commercially available PLL IC. In accordance with the invention, these circuit blocks are alternately actuated both in the transmitting state and in the receiving state of the radio transmission and reception apparatus. This double use means that a further PLL circuit of this type can be dispensed with.

FIG. 6 shows an oscillator circuit that can operate both as a quartz-stable reference oscillator and as a voltage-controlled oscillator VCO. The changeover between the two operating modes is achieved by alternately switching through the two switching diodes 15. At the control voltage input 9, the RC resonating circuit 14 of the oscillator can be controlled over a wide range in the VCO mode using the capacitance diode 8. In its mode as a quartz-stable reference oscillator, the oscillation of the reference quartz 13 can be detuned only in a narrow range around its center frequency. The oscillators are connected via a capacitance network to an active element 17 usually provided in the PLL IC. An oscillator combined in this way is particularly suitable for use as a switchable oscillator in one of the circuit arrangements according to FIGS. 3 to 5. The changeover of the oscillator takes place together with the changeover of switches A1 to A3.

A radio transmission and receiving apparatus of this type is particularly suitable for use in radio remote control equipment designed for bidirectional transmission and reception in time offset operation. Its space-saving overall circuit, in which the transmission and reception sections are combined into a single unit using the same phase-locked loop, results in small dimensions for the portable radio remote control units.

We claim:

1. A radio transmission and reception apparatus having a transmitting section, a receiving section, and a common phase locked loop (PLL) circuit connected to said transmitting and receiving sections for signal modulation and demodulation, respectively, and wherein said common PLL circuit comprises a phase detector having first and second inputs and a feedback loop between its output and one of its inputs, a first voltage controlled oscillator (VCO), a further oscillator operating either as a reference oscillator or as a second VCO, and a switch arrangement for selectively interconnecting the phase detector, the first VCO and the further oscillator such that in a transmitting state of the radio transmission and reception apparatus, the feedback loop of the PLL circuit is closed via the first VCO and is connected to the first input of the phase detector, and the further oscillator operates as the reference oscillator which is connected to the second input of the phase detector, and, in a receiving state of the radio transmission and reception apparatus, the feedback loop is closed via the further oscillator operating as the second VCO and is connected to the second input of the phase detector, and the phase detector has its first input connected to an output of an HF input stage.

2. A radio transmission and reception apparatus according to claim 1, wherein signal modulation in the transmitting state is achieved by means for detuning the further oscillator operating as the reference oscillator.

3. A radio transmission and reception apparatus according to claim 1, comprising a controllable frequency divider stage disposed in the feedback loop between an output of the first VCO and the first input of the phase detector during the transmitting state; and wherein signal modulation in the transmitting state is achieved by changing a divider ratio of the frequency divider stage disposed in the feedback loop of the PLL circuit.

4. A radio transmission and reception apparatus according to claim 1, further comprising at least one antenna connected to the transmitting and receiving sections for transmission and reception of a signal.

5. A radio transmission and reception apparatus according to claim 4, wherein said at least one antenna includes a transmitting antenna and a receiving antenna connected to the transmitting section and the receiving section, respectively, and wherein the switch arrangement includes a further switch for selectively connecting the transmitting section or the receiving section to the PLL circuit.

6. A radio transmission and reception apparatus according to claim 1 further comprising circuit means for causing all switches included in the switching arrangement to change from the transmitting to the receiving state in response to a changeover signal.

7. A radio transmission and reception apparatus according to claim 1 wherein: the first VCO has a control input connected to the output of the phase detector and an output connected to one input of a first switch of the switch arrangement; the receiving section has its output connected to a further input of the first switch whose common output is connected to the first input of the phase detector; the further oscillator has its output connected to the second input of the phase detector and a control input connected via a series connection of a second switch, which is open when the apparatus is in the transmitting state and closed when the apparatus is in the receiving state, and an inverter to the output of the phase detector.

8. A radio transmission and reception apparatus according to claim 7 further comprising a loop filter connected to the output of the phase detector; and wherein the inverter and the first VCO are connected to the output of the phase detector via the loop filter.

9. A radio transmission and reception apparatus according to claim 7 further comprising means, responsive to a data signal and connected between the control input of the further oscillator and the second switch, for detuning the further oscillator during the transmitting stage to modulate an oscillating state of the PLL circuit.

10. A radio transmission and reception apparatus according to claim 9 wherein the means for detuning is a capacitance diode.

11. A radio transmission and reception apparatus according to claim 7 wherein the common output of the first switch is connected to the first input of the phase detector via a frequency divider having a controllable divider ratio and a control input for receiving a data input which controls the divider ratio.

12. A radio transmission and reception apparatus according to claim 1 wherein: the first VCO has a control input connected to the output of the phase detector and an output connected to the first input of the phase detector; the further oscillator has its output connected to the second input of the phase detector and a control input connected to a means for controlling an oscillating state of the further oscillator, the means for controlling normally causing the further oscillator to act as the reference oscillator and being responsive to an input data signal to detune the further oscillator during the transmitting state to modulate the oscillating state of the PLL circuit; the switch arrangement includes a first switch, which is open during the transmitting state and is closed during the receiving state, connected between a control input of the means for controlling and the output of the phase detector via an inverter; the switch arrangement further includes a second switch connecting the first VCO to a source of operating voltage during the transmitting state and disconnecting the first VCO from the source of operating voltage during the receiving state; and the transmitting section and the receiving section are connected to an output of the first VCO.

13. A radio transmission and reception apparatus according to claim 12 wherein the switch arrangement includes a third switch for connecting the transmitting section to the output of the first VCO during the transmitting state and the receiving section to the output of the first VCO during the receiving state.

14. A radio transmission and reception apparatus according to claim 1 wherein alternating access to the common PLL circuit by the transmitting and receiving sections takes place via the switching arrangement in a time-division multiplex mode.

* * * * *